United States Patent
Rattray et al.

(10) Patent No.: US 10,081,174 B2
(45) Date of Patent: Sep. 25, 2018

(54) RE-INKING ROLLER FOR MICROCONTACT PRINTING IN A ROLL-TO-ROLL PROCESS

(71) Applicant: 3M INNOVATIVE PROPERTIES COMPANY, St. Paul, MN (US)

(72) Inventors: Tyler J. Rattray, Minneapolis, MN (US); Mikhail L. Pekurovsky, Bloomington, MN (US); Lyudmila A. Pekurovsky, Bloomington, MN (US); Matthew H. Frey, Cottage Grove, MN (US); Daniel P. Meehan, Newport, MN (US); Jonathan J. O'Hare, Oakdale, MN (US); Richard W. Greger, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/655,844

(22) PCT Filed: Dec. 19, 2013

(86) PCT No.: PCT/US2013/076563
§ 371 (c)(1),
(2) Date: Jun. 26, 2015

(87) PCT Pub. No.: WO2014/105637
PCT Pub. Date: Jul. 3, 2014

(65) Prior Publication Data
US 2015/0336379 A1    Nov. 26, 2015

Related U.S. Application Data

(60) Provisional application No. 61/747,985, filed on Dec. 31, 2012.

(51) Int. Cl.
*B41F 5/24*     (2006.01)
*B41F 17/00*    (2006.01)
(Continued)

(52) U.S. Cl.
CPC ............... *B41F 31/16* (2013.01); *B41F 5/24* (2013.01); *B41F 11/02* (2013.01); *B41F 17/00* (2013.01);
(Continued)

(58) Field of Classification Search
CPC . B41F 5/24; B41F 17/00; B41M 1/04; B41M 3/006; G03F 7/0002; H01L 51/0004; H01L 51/0022; H05K 3/1275
See application file for complete search history.

(56) References Cited

U.S. PATENT DOCUMENTS 3,812,782 A * 5/1974 Funahashi ............... B41F 31/22
                                            101/367
4,246,842 A * 1/1981 Williams ................. B41K 3/60
                                            101/331
(Continued)

FOREIGN PATENT DOCUMENTS

CN       101094936 A      12/2007
JP    1987(S62)-282963 A  12/1987
(Continued)

OTHER PUBLICATIONS

Libioulle, "Contact-Inking Stamps for Microcontact Printing of Alkanethiols on Gold", Langmuir, 1999, vol. 15, pp. 300-304.
(Continued)

*Primary Examiner* — Jennifer Simmons
*Assistant Examiner* — Leo T Hinze
(74) *Attorney, Agent, or Firm* — James A. Baker

(57) ABSTRACT

A system, including a moving web of material unwound from a support and a stamp mounted on a roller, wherein the stamp includes a base surface and a continuous, regular array of pattern elements having a trapezoidal cross-sectional shape and extending above the base surface, and wherein the stamping elements each have a substantially
(Continued)

planar stamping surface. An inking roller with an inking surface at least periodically contacts the stamping surface of the stamping elements. The inking surface is impregnated with an ink composition including an organosulfur compound having a thiol functional group selected to bind to a major surface of the web material to form a self-assembled monolayer (SAM) thereon according to the array of pattern elements on the stamping surface.

16 Claims, 7 Drawing Sheets

(51) Int. Cl.
H05K 3/12 (2006.01)
H01L 51/00 (2006.01)
B41F 31/16 (2006.01)
B41F 31/22 (2006.01)
B41F 11/02 (2006.01)
H05K 3/06 (2006.01)

(52) U.S. Cl.
CPC .......... *B41F 31/22* (2013.01); *H01L 51/0004* (2013.01); *H05K 3/061* (2013.01); *H05K 3/1275* (2013.01)

(56) References Cited

U.S. PATENT DOCUMENTS

| | | | |
|---|---|---|---|
| 4,672,893 A | 6/1987 | Mammarella, Sr. | |
| 5,079,600 A | 1/1992 | Schnur | |
| 5,512,131 A | 4/1996 | Kumar | |
| 6,180,239 B1 | 1/2001 | Whitesides et al. | |
| 6,234,078 B1* | 5/2001 | Kessler | B41F 31/22 101/329 |
| 6,780,492 B2* | 8/2004 | Hawker | B05D 1/185 428/198 |
| 8,794,150 B2* | 8/2014 | Theis | B41F 17/00 101/216 |
| 9,205,638 B2* | 12/2015 | Zwadlo | G03F 7/0002 |
| 2003/0075257 A1* | 4/2003 | Salvestro | B41C 1/184 156/64 |
| 2006/0121271 A1 | 6/2006 | Frey | |
| 2009/0238984 A1* | 9/2009 | Tomita | B41F 27/14 427/428.01 |
| 2010/0258968 A1 | 10/2010 | Zu | |
| 2010/0297190 A1* | 11/2010 | Loiret-Bernal | B30B 15/065 424/400 |
| 2011/0126730 A1* | 6/2011 | Berniard | B82Y 10/00 101/483 |
| 2011/0278767 A1* | 11/2011 | Aviel | B41C 1/05 264/400 |
| 2012/0070570 A1* | 3/2012 | Kim | H01B 1/02 427/192 |
| 2014/0047992 A1* | 2/2014 | Ramakrishnan | G03F 7/2014 101/395 |

FOREIGN PATENT DOCUMENTS

| | | |
|---|---|---|
| JP | H05-37371 U | 2/1993 |
| JP | H11-138077 A | 5/1999 |
| JP | 2010-208921 | 9/2010 |
| KR | 10-0787237 B1 | 12/2007 |
| TW | 200945445 A | 11/2009 |
| WO | WO 2004-004025 | 1/2004 |
| WO | WO 2004/057110 A1 | 7/2004 |
| WO | WO 2009/108771 A2 | 9/2009 |
| WO | WO 2011/090641 A2 | 7/2011 |

OTHER PUBLICATIONS

Love, "Self-Assembled Monolayers of Thiolates on Metals as a Form of Nanotechnology", Chemical Reviews, 2005, vol. 105, pp. 1103-1169.
Ulman, "Formation and Structure of Self-Assembled Monolayers", Chemical Reviews, 1996, vol. 96, pp. 1533-1554.
International Search Report for PCT International Application No. PCT/US2013/076563, dated Jun. 6, 2014, 3pgs.
Self-Assembled Monolayer, Types of SAMs, Wikipedia, http://web.archive.org/web/20101125044715/http://en.wikipedia.org/wiki/self-assembled_monolayer.

* cited by examiner

RE-INKING ROLLER FOR MICROCONTACT PRINTING IN A ROLL-TO-ROLL PROCESS

CROSS REFERENCE TO RELATED APPLICATIONS

This application is a national stage filing under 35 U.S.C. 371 of PCT/US2013/076563, filed Dec. 19, 2013, which claims priority to U.S. Application No. 61/747,985, filed Dec. 31, 2012, the disclosure of which is incorporated by reference in its/their entirety herein.

BACKGROUND

Microcontact printing is a printing technique that can be used, for example, to generate patterns of functionalizing molecules on a surface of a substrate. The functionalizing molecules include a functional group that attaches to a substrate surface or a coated substrate surface via a chemical bond to form a patterned self-assembled monolayer (SAM). The SAM is a single layer of molecules attached by a chemical bond to a surface and that have adopted a preferred orientation with respect to that surface and even with respect to each other.

A basic method for microcontact printing SAMs involves applying an ink containing the functionalizing molecules to a relief-patterned elastomeric stamp (for example, a poly (dimethylsiloxane) (PDMS) stamp) and then contacting the inked stamp to a substrate surface, usually a metal or metal oxide surface, so that SAMs form in the regions of contact between the stamp and the substrate. Alternatively, the elastomeric stamp can be flat (not containing a relief pattern) and the substrate surface can be relief patterned. Micropatterned organic and inorganic materials printed using microcontact printing methods can potentially provide unique electrical, optical, and/or biological properties to substrates such as metallized polymeric films.

In a manufacturing process the functionalizing molecules should be reproducibly transferred from the stamp to the substrate surface in a desired high-resolution patterned SAM with a minimum number of defects. As microcontact printing speeds increase in roll-to-roll manufacturing processes on a moving web of material, pattern defects such as line blurring and voids should be minimized to ensure accurate SAM pattern resolution and reproducibility.

SUMMARY

In general, the present disclosure is directed to roll-to-roll printing apparatus and processes utilizing micro-contact printing stamps. The printing stamps can be periodically or continuously re-inked by contacting a stamping surface of the stamp with a re-inking roller, which reduces process down time previously devoted to charging the stamps with an ink composition.

In one embodiment, the present disclosure is directed to a system, including a moving web of material unwound from a support; a stamp mounted on a roller, wherein the stamp includes a base surface and a continuous, regular array of pattern elements having a trapezoidal cross-sectional shape and extending above the base surface, and wherein the stamping elements each have a substantially planar stamping surface; and an inking roller with a inking surface that at least periodicially contacts the stamping surface of the stamping elements. The inking surface is impregnated with an ink composition including an organosulfur compound having a thiol functional group selected to bind to a major surface of the web material to form a self-assembled monolayer (SAM) thereon according to the array of pattern elements on the stamping surface.

In another embodiment, the present disclosure is directed to a system including a moving web of material unwound from a roller; an elastomeric stamp attached to a print roller, wherein the stamp has a stamping surface in contact with a major surface of the web of material; and an apparatus for inking the stamping surface with an ink composition including an organosulfur compound and an organic solvent. The apparatus for inking includes a re-inking roller with an inking surface impregnated with the ink composition, and the inking surface at least periodically contacts the stamping surface of the stamp.

In another embodiment, the present disclosure is directed to a method including unwinding a web material from a support; providing an elastomeric stamp impregnated with an ink composition with a functionalizing molecule, wherein the functionalizing molecule includes a functional group selected to bind to said substrate material; contacting a stamping surface of the stamp with a major surface of the web material for a print time sufficient to bind the functional group with the web material to form a self-assembled monolayer (SAM) of the functionalizing material on the major surface of the web material according to an arrangement of pattern elements on the stamping surface; and contacting the stamping surface of the stamp at least periodically with a re-inking roller, wherein the re-inking roller includes an inking surface impregnated with the ink composition.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

The disclosure may be more completely understood in consideration of the following detailed description of various embodiments of the disclosure in connection with the accompanying drawings, in which it is to be understood by one of ordinary skill in the art that the drawings illustrate certain exemplary embodiments only, and are not intended as limiting the broader aspects of the present disclosure.

While the above-identified drawings, which may not be drawn to scale, set forth various embodiments of the present disclosure, other embodiments are also contemplated, as noted in the Detailed Description. Like symbols in the figures indicate like elements.

DETAILED DESCRIPTION

Figure 1:
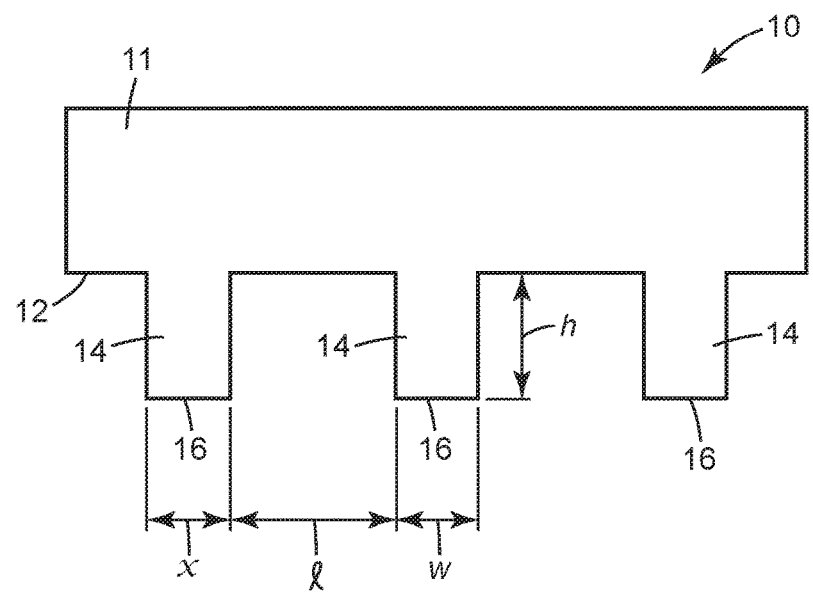
FIG. 1 is a schematic cross-sectional view of an embodiment of a high-aspect ratio stamp for microcontact printing.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. At the very least, and not as an attempt to limit the application of the doctrine of equivalents to the scope of the claimed embodiments, each numerical parameter should at least be construed in light of the number of reported significant digits and by applying ordinary rounding techniques. In addition, the use of numerical ranges with endpoints includes all numbers within that range (e.g. 1 to 5 includes 1, 1.5, 2, 2.75, 3, 3.80, 4, and 5) and any narrower range or single value within that range.

Glossary:

Certain terms are used throughout the description and the claims that, while for the most part are well known, may require some explanation. It should be understood that, as used herein:

The terms "about," "approximate," or "approximately" with reference to a numerical value or a geometric shape means +/− five percent of the numerical value or the value of the internal angle between adjoining sides of a geometric shape having a commonly recognized number of sides, expressly including any narrower range within the +/− five percent of the numerical or angular value, as well as the exact numerical or angular value. For example, a temperature of "about" 100° C. refers to a temperature from 95° C. to 105° C., but also expressly includes any narrower range of temperature or even a single temperature within that range, including, for example, a temperature of exactly 100° C. Likewise, an "approximately square" geometric shape includes all four-sided geometric shapes exhibiting internal angles between adjoining sides of 85-95 degrees from the 90 degree internal angle between adjoining sides corresponding to a perfect square geometric shape.

The term "substantially" with reference to a property or characteristic means that the property or characteristic is exhibited to within 98% of that property or characteristic, but also expressly includes any narrow range within the two percent of the property or characteristic, as well as the exact value of the property or characteristic. For example, a substrate that is "substantially" transparent refers to a substrate that transmits 98-100% of incident light.

The terms "a", "an", and "the" include plural referents unless the content clearly dictates otherwise. Thus, for example, reference to a material containing "a compound" includes a mixture of two or more compounds.

The term "or" is generally employed in its sense including "and/or" unless the content clearly dictates otherwise.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

FIG. 1 shows a schematic illustration of a microcontact printing stamp 10, which includes a substantially planar base surface 12. An array of pattern elements 14 extends away from the base surface 12. In some embodiments the stamp 10 is a unitary block of an elastomeric material, and in other embodiments may include elastomeric pattern elements 14 supported by an optional reinforcing backing layer 11. The array of pattern elements 14 on the base surface 12 of the stamp 10 can vary widely depending on the intended microcontact printing application, and can include, for example, regular or irregular patterns of elements such as lines, dots, and polygons.

The pattern elements 14 in the array on the base surface 12 can be described in terms of their shape, orientation, and size. The pattern elements 14 have a base width x at the base surface 12, and include a stamping surface 16. The stamping surface 16 resides a height h above the base surface 12, and has a lateral dimension w, which may be the same or different from the base width x. The pattern elements 14 have an aspect ratio h/w that is at least about 1.5. In various embodiments, the aspect ratio of the height h of the pattern elements 14 to the width w of the pattern elements 14 is about 1.5 to about 5.0, about 1.5 to about 3.0, or about 1.5 to about 2.0.

The methods and apparatuses described herein are particularly advantageous for small pattern elements 14 with a stamping surface 16 having a minimum lateral dimension w of less than about 10 μm, or less than about 5 μm, or less than about 1 μm. In the embodiment shown in FIG. 1 the stamping surface 16 is substantially planar and substantially parallel to the base surface 12, although such a parallel arrangement is not required. The methods and apparatuses reported herein are also particularly advantageous for microcontact printing with pattern elements 14 having a height h of about 50 μm or less, or about 10 μm or less, or about 5 μm or less, or about 1 μm or less, or about 0.25 μm or less.

The pattern elements 14 can occupy all or just a portion of the base surface 12 (some areas of the base surface 12 can be free of pattern elements). For example, in various embodiments the spacing l between adjacent pattern elements can be greater than about 50 μm, or greater than about 100 μm, or greater that about 200 μm, or greater than about 300 μm, or greater than about 400 μm, or even greater than about 500 μm. Commercially useful arrays of pattern elements 14 for microcontact printing cover areas of, for example, greater than 100 square centimeters, greater than 200 cm$^2$, or even greater than 1000 cm$^2$ on the base surface 12 of the stamp 10.

In some embodiments, the pattern elements 14 can form a "micropattern," which in this application refers to an arrangement of dots, lines, filled shapes, or a combination thereof having a dimension (e.g. line width) of no greater than 1 μm. In some embodiments, the arrangement of dots, lines, filled shapes, or a combination thereof have a dimension (e.g. line width) of at least 0.5 μm and typically no greater than 20 μm. The dimension of the micropattern pattern elements 14 can vary depending on the micropattern selection, and in some embodiments, the micropattern pattern elements have a dimension (e.g. line width) that is less than 10, 9, 8, 7, 6, or 5 μm (e.g., 0.5-5 μm or 0.75-4 μm).

In some embodiments, the pattern elements are traces, which may be straight or curved. In some embodiments the pattern elements are traces that form a two-dimensional network (i.e., mesh). A mesh comprises traces that bound open cells. The mesh may be, for example, a square grid, a hexagonal mesh, or a pseudorandom mesh. Pseudorandom refers to an arrangement of traces that lacks translational symmetry, but that can be derived from a deterministic fabrication process (e.g., photolithography or printing), for example including a computational design process that includes generation of the pattern geometry with a randomization algorithm. In some embodiments, the mesh has an open area fraction of between 90 percent and 99.75 percent (i.e., density of pattern elements of between 0.25 percent and 10 percent). In some embodiments, the mesh has an open area fraction of between 95 percent and 99.5 percent (i.e., density of pattern elements of between 0.5 percent and 5 percent). The pattern elements may have combinations of the aspects described above, for example they may be curved traces, form a pseudorandom mesh, have a density of between 0.5 percent and 5 percent, and have a width of between 0.5 μm and 5 μm.

Figure 2:
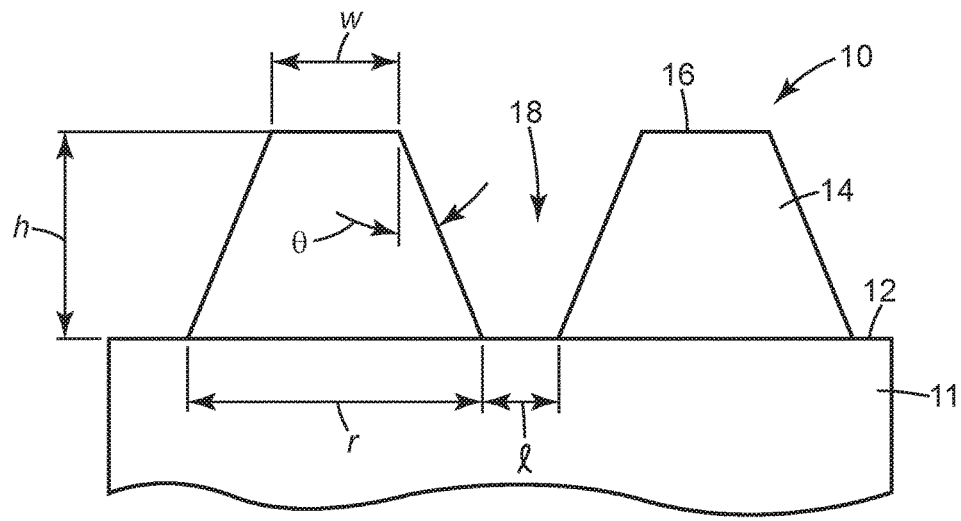
FIG. 2 is a schematic cross-sectional view of another embodiment of a high-aspect ratio stamp for microcontact printing.

In an embodiment of a stamp 10 shown schematically in FIG. 2, the pattern elements 14 have a trapezoidal cross-sectional shape with a base width r, a height h above the base surface 12, and a vertical angle θ. The pattern elements 14 have a pitch 1 and stamping surfaces 16 with a width w. In the embodiment shown in FIG. 2, the stamping surfaces 16 extend in substantially parallel lines across the base surface 12 of the stamp 10 to form a square grid-like arrangement. The regions between the lines of pattern elements 14 thus form channels 18. Many different configurations are possible. For example, in some embodiments the stamping surfaces are hexagons defined by pattern elements in the form of lines that define a hexagonal network resembling a two-dimensional mesh-like network (See, for example, FIG. 11). The aspect ratio of pattern elements for embodiments illustrated in FIG. 2 is given by h/w.

Figure 3:
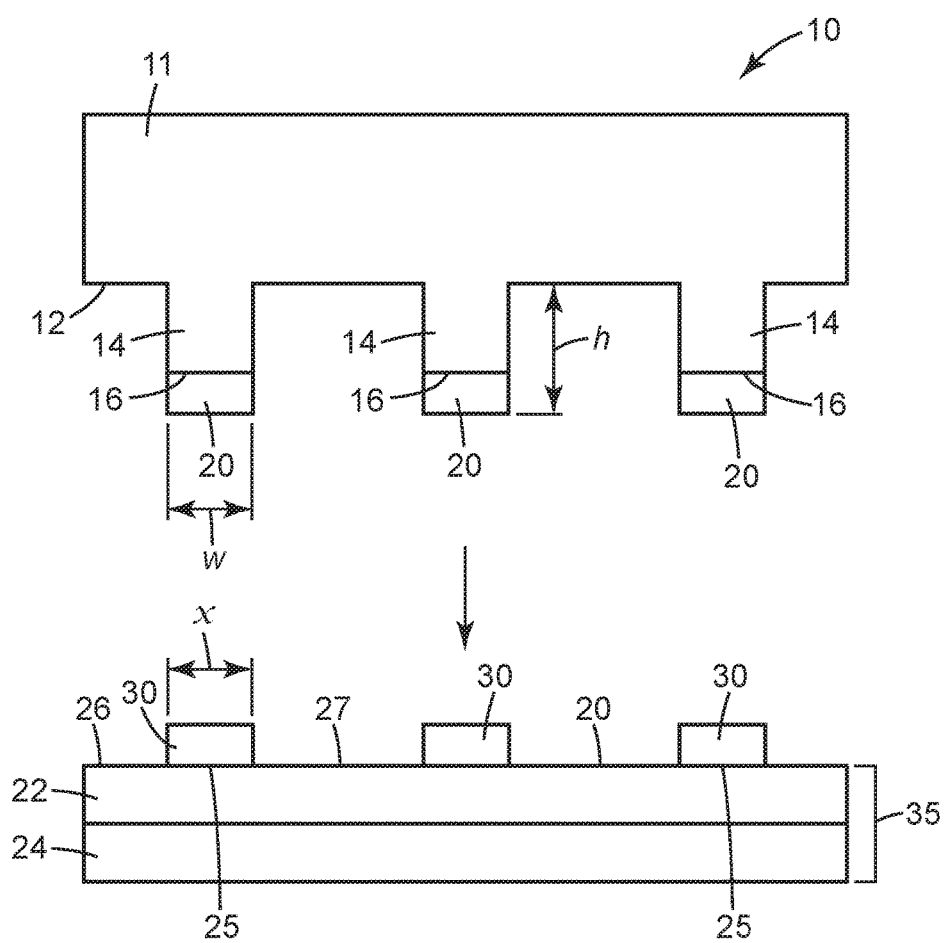
FIG. 3 is a schematic cross-sectional view of a process for forming a self-assembled monolayer (SAM) on a substrate using a high-aspect ratio stamp in a microcontact printing process.

Referring to FIG. 3, an ink 20 including a functionalizing molecule resides on the stamping surfaces 16 of the stamp 10. The functionalizing molecules in the ink 20 include a functional group selected to bind to a selected surface material 22 on a support layer 24 of a substrate 35. The stamp 10 is positioned and is brought into contact with a surface 26 of the material 22, and the stamping surfaces 16 are held against a first portion 25 of the surface 26 on the material 22. The functionalizing molecules in the ink 20 are held against the surface 26 to allow the functional group to bind thereto (holding step not shown in FIG. 3). Then, the stamping surface 16 is removed, and the ink remaining on the surface 26 chemically binds to the surface and forms a self-assembled monolayer (SAM) 30 on the portions 25 of the surface 26 according to the shapes and dimensions of the stamping surfaces 16. Portions 27 of the surface 26, contiguous with first portions 25, remain free of the SAM 30.

The methods, apparatuses and printing stamps described herein are particularly advantageous for use in printing on a flexible substrate in a roll-to-roll process. The flexible substrate is typically an elongate web of a material that has a length much greater than its width. In some embodiments, the flexible substrate is capable of wrapping around the circumference of a cylinder of less than about 50 centimeters (cm) diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The preferred flexible substrate may be rolled upon itself.

In some embodiments, the flexible substrate material is a polymeric "film," a polymer material in the form of a flat sheet or web that is sufficiently flexible and strong to be processed in a roll-to-roll fashion. In some embodiments, the polymeric film web includes a relatively thin metal coating on a surface to which the ink from the stamp is to be applied. The metal coating may vary widely depending on the intended application, but should be sufficiently thin such that the web retains its flexibility as defined above.

These material thicknesses allow for roll-to-roll processing, which in some embodiments may be continuous, providing economy of scale and economy of manufacturing over some flat and/or rigid substrates. In this application, roll-to-roll refers to a process where material is wound onto or unwound from a support, and may optionally be further processed in some way. Examples of further processes include coating, slitting, blanking, and exposing to radiation, or the like.

Polymeric films suitable for roll-to-roll processing can be manufactured in a variety of thickness, ranging in general from about 5 μm to about 1000 μm. In many embodiments, polymeric film thicknesses range from about 25 μm to about 500 μm, or from about 50 μm to about 250 μm, or from about 75 μm to about 200 μm.

If the substrate 35 is in relative motion with respect to the stamp 10, such as, for example, if the substrate 35 is a moving web of material in a roll-to-roll manufacturing process, a smearing of the ink 20 can occur on the surface 26. For example, such smearing can result in a SAM 30 having a line width longer and/or wider than the dimensions of the printing surface 16 (FIG. 3), which results in poor fidelity between the pattern expressed by the array of pattern elements 14 and the resulting printed SAM 30 on the surface 26. This relative motion between the stamp 10 and the substrate 35 begins when tangentional (frictional) stress between the surface 26 and the printing surface 16 of the stamp exceeds a predetermined value. Some amount if mismatch between the surface 26 and the stamp 10 is always present due to fluctuations in the velocity of the moving substrate 35. Release of the surface 26 from the stamping surface 16 can be impacted by at least one of: (1) the elastomeric properties of the pattern elements 14 and/or the optional stamp support 11, as well as (2) the aspect ratios of the pattern elements 14. Careful control of these parameters can reduce stress at the interface between the substrate surface 26 and the stamping surface 16.

Figure 4A:
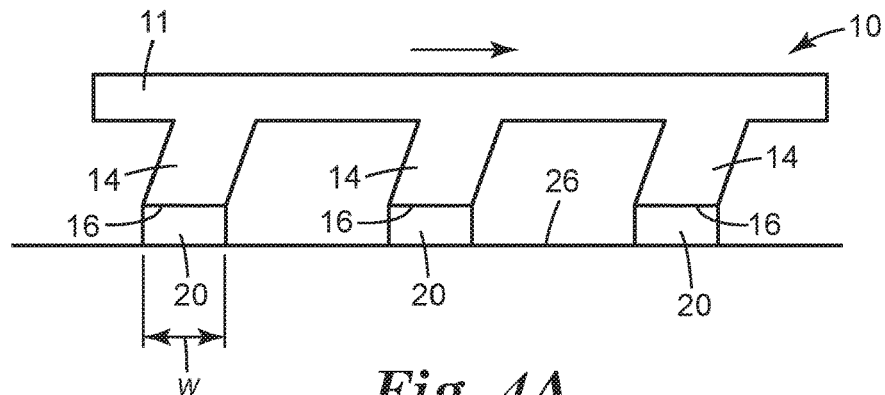
FIGS. 4A and 4B are schematic cross-sectional views of stamps for microcontact printing utilized in a process in which a substrate is in motion relative to the stamps.
Figure 4B:
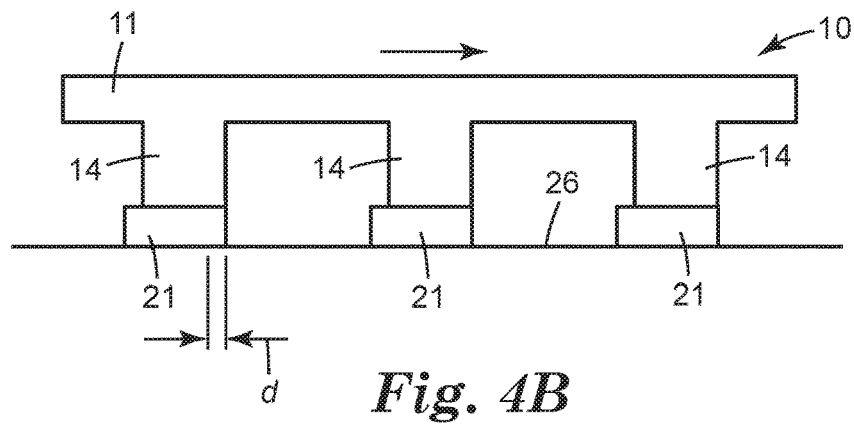

As shown schematically in FIG. 4A, if the stamping elements 14 deform when a mismatch between the substrate surface 26 and the stamping surface 16 occurs, a pattern of the ink 20 can be accurately transferred from the stamping surfaces 16 to the surface 26 of the substrate without line widening in the resulting SAM 30 (in other words, the line width of the stamping surface 16 on the stamp 10 is substantially the same as the line width in the SAM 30). However, as shown in FIG. 4B, if the stamping elements 14 do not deform when a substrate/stamp speed mismatch occurs, slippage takes place at the substrate/stamp interface and the resulting smeared pattern of ink 21 widens by a distance 6 with respect to the width w of the stamping surface 16 on the stamp 10, reducing the fidelity of the transfer of the ink 20 from the stamp 10 to the substrate surface 26.

In a selected stamp material, the presently claimed method is based at least in part on the finding that pattern elements with an aspect ratio greater than about 1.5 tend to more effectively deform (bend) when velocity differences and relative displacement are present at the substrate/stamp interface. This deformation reduces the stress at the substrate/stamp interface, reducing the tendency of the stamping surfaces 16 to slip on the substrate 26 and widen or otherwise smear the ink 20 and the resulting SAM 30. Because stiffness of a beam scales with cube of its length, the effect of the aspect ratio of the pattern elements 14 is significant. For example, for the same relative displacement, a pattern element 14 that is twice as tall will have almost ten times less frictional force at the stamping surface 16.

In a roll-to-roll process in which the substrate surface 26 is moving rapidly with respect to the stamp 10, as speed of printing increases, more air gets trapped between the stamp 10 and the surface 26 of the substrate 35. When the thickness of this trapped air becomes larger than the approximate height h of the pattern elements 14 (FIG. 1), no contact between the stamping surfaces 16 and the substrate surface 26 is established and print is missed from a large, somewhat irregular areas of the surface 26. Increasing the aspect ratio and height h of the pattern elements 14 this can allow microcontact printing at higher speeds, and the stamp 10 can operate with thicker entrained air layers without creating print defects.

Further, if dust particles are trapped between the substrate surface 26 and the stamp 10, the stamping surfaces 16 can lose contact with the surface 26 and create an area on the substrate 26 where no print is formed. Higher aspect ratio pattern elements 14 have a larger height h, which allows entrapment of larger dust particles without generating unprinted areas on the substrate surface 26.

As noted above, the stamp 10 should be elastic, such that the stamping surfaces 16 can very closely conform to minute irregularities in the surface 26 of the material 22 and completely transfer the ink 20 thereto. This elasticity allows the stamp 10 to accurately transfer the functionalizing molecules in the ink 20 to nonplanar surfaces. However, the pattern elements 14 should not be so elastic that when the stamping surfaces 16 are pressed lightly against a surface 26, the pattern elements 14 deform to the extent that blurring of the ink 20 on the substrate surface 26 results.

The stamp 10 should also be formed such that stamping surface 16 includes an absorbent material selected to absorb the ink 20 to be transferred to a surface 26 to form a SAM 30 thereon. The stamping surface 16 preferably swells to absorb the ink 20, which can include functionalizing molecules alone or suspended in a carrier such as an organic solvent. Such swelling and absorbing characteristics provide good definition of an isolated SAM 30 on a substrate surface 26. For example, if a dimensional feature of stamping surface 16 has a particular shape, the surface 16 should transfer the ink 20 to the surface 26 of material 22 to form SAMs 30 mirroring the features of the stamping surface 16, without blurring or smudging. The ink is absorbed into the stamping surface 16, and when stamping surface 16 contacts material surface 26, the ink 20 is not dispersed, but the functional groups on the functionalizing molecules chemically bind to the surface 26, and removal of the stamping surface 16 from the surface 26 results in a SAM 30 with well-defined features.

Useful elastomers for forming the stamp 10 include polymeric such as, for example, silicones, polyurethanes, ethylene propylene diene M-class (EPDM) rubbers, as well as commercially available flexographic printing plate materials (for example, those commercially available from E. I. du Pont de Nemours and Company, Wilmington, Del., under the trade designation Cyrel). The stamp can be made from a composite material including, for example, an elastomeric material on the stamping surfaces 16 combined with a woven or non-woven fibrous reinforcement 11 (FIG. 1).

Polydimethylsiloxane (PDMS) is particularly useful as a stamp material, as it is elastomeric and has a low surface energy (which makes it easy to remove the stamp from most substrates). A useful commercially available formulation is available from Dow Corning, Midland, Mich., under the trade designation Sylgard 184 PDMS. PDMS stamps can be formed, for example, by dispensing an un-crosslinked PDMS polymer into or against a patterned mold, followed by curing. The master tool for molding the elastomeric stamps can be formed using photolithography techniques known in the art. The elastomeric stamp can be molded against the master tool by applying uncured PDMS to the master tool and then curing.

The material 22 and the ink 20 are selected such that the functionalizing molecules therein include a functional group that binds to a surface 26 of the material 22. The functional group may reside at the physical terminus of a functionalizing molecule as well as any portion of a molecule available for forming a bond with the surface 26 in a way that the molecular species can form a SAM 30, or any portion of a molecule that remains exposed when the molecule is involved in SAM formation. In some embodiments, the functionalizing molecules in the ink 20 may be thought of as having first and second terminal ends, separated by a spacer portion, the first terminal end including a functional group selected to bond to surface 26, and the second terminal group optionally including a functional group selected to provide a SAM 30 on material surface 26 having a desirable exposed functionality. The spacer portion of the molecule may be selected to provide a particular thickness of the resultant SAM 30, as well as to facilitate SAM formation. Although SAMs of the present invention may vary in thickness, SAMs having a thickness of less than about 50 Å are generally preferred, more preferably those having a thickness of less than about 30 Å and more preferably those having a thickness of less than about 15 Å. These dimensions are generally dictated by the selection of molecular species 20 and in particular the spacer portion thereof.

Additionally, SAMs 30 formed on surface 26 may be modified after such formation for a variety of purposes. For example, a functionalizing molecule in the ink 20 may be deposited on surface 26 in a SAM, the functionalizing molecule having an exposed functionality including a protecting group which may be removed to effect further modification of the SAM 30. Alternately, a reactive group may be provided on an exposed portion of the functionalizing molecule in the ink 20 that may be activated or deactivated by electron beam lithography, x-ray lithography, or any other radiation. Such protections and de-protections may aid in chemical or physical modification of an existing surface-bound SAM 30.

The substrate surface 26, which is made of a material 22, is the surface on which the SAM 30 forms. The term substrate 35 also may optionally include a physical support layer 24 under the surface material 22. In some embodiments, the substrate surface 26 is substantially planar. Useful substrate materials 22 can include an inorganic material (for example, metallic or metal oxide material, including polycrystalline materials) coating on a polymeric film 24, or on a glass or silicon wafer 24. The inorganic material coating 22 can include, for example, elemental metal, metal alloys, intermetallic compounds, metal oxides, metal sulfides, metal carbides, metal nitrides, and combinations thereof. Exemplary metallic surfaces 22 for supporting SAMs include gold, silver, palladium, platinum, rhodium, copper, nickel, iron, indium, tin, tantalum, aluminum, as well as mixtures, alloys, and compounds of these elements. Gold is a preferred metallic surface 22.

Metal coatings 22 on the polymeric film or glass or silicon wafer substrate 24 can be any thickness such as, for example, from about 10 nanometers (nm) to about 1000 nm. The inorganic material coating can be deposited using any convenient method, for example sputtering, evaporation, chemical vapor deposition, or chemical solution deposition (including electroless plating).

Preferred combinations of materials 22 and functional groups for functionalizing molecules in the ink 20 include, but are not limited to: (1) metals such as gold, silver, copper, cadmium, zinc, palladium, platinum, mercury, lead, iron, chromium, manganese, tungsten, and any alloys of the above with sulfur-containing functional groups such as thiols, sulfides, disulfides, and the like; (2) doped or undoped silicon with silanes and chlorosilanes; (3) metal oxides such as silica, alumina, quartz, glass, and the like with carboxylic acids; (4) platinum and palladium with nitriles and isonitriles; and (4) copper with hydroxamic acids. Additional suitable functional groups on the functionalizing molecules in the ink 20 include acid chlorides, anhydrides, sulfonyl groups, phosphoryl groups, hydroxyl groups and amino acid groups. Additional surface materials 22 include germanium, gallium, arsenic, and gallium arsenide. Additionally, epoxy compounds, polysulfone compounds, plastics and other polymers may find use as the material 22. Additional materials and functional groups suitable for use in the present invention can be found in U.S. Pat. Nos. 5,079,600 and 5,512,131.

In some embodiments, the functionalizing molecules utilized to form SAMs in the presently-described process are delivered to the stamp 10 as ink solutions 20 including one or more organosulfur compounds as described in U.S. Patent Application Pub. No. 2010/0258968. Each organosulfur compound is preferably a thiol compound capable of forming a SAM 30 on a selected surface 26 of a material 22. The thiols include the —SH functional group, and can also be called mercaptans. The thiol group is useful for creating a chemical bond between molecules of the functionalizing compound in the ink 20 and the surface 22 of a metal. Useful thiols include, but are not limited to, alkyl thiols and aryl thiols. Other useful organosulfur compounds include dialkyl disulfides, dialkyl sulfides, alkyl xanthates, dithiophosphates, and dialkylthiocarbamates.

Preferably the ink solution 20 includes alkyl thiols such as, for example, linear alkyl thiols: $HS(CH_2)_n X$, wherein n is the number of methylene units and X is the end group of the alkyl chain (for example, X=—$CH_3$, —OH, —COOH, —$NH_2$, or the like). Preferably, X=—$CH_3$. Other useful functional groups include those described, for example, in: (1) Ulman, "Formation and Structure of Self-Assembled Monolayers", *Chemical Reviews* Vol. 96, pp. 1533-1554 (1996); and (2) Love et al., "Self-Assembled Monolayers of Thiolates on Metals as a Form of Nanotechnology", *Chemical Reviews* Vol. 105, pp. 1103-1169 (2005).

Useful alkyl thiols can be linear alkyl thiols (that is, straight chain alkyl thiols) or branched, and can be substituted or unsubstituted. The optional substituents preferably do not interfere with the formation of a SAM. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol).

Preferred linear alkyl thiols have 10 to 20 carbon atoms (more preferably, 12 to 20 carbon atoms; most preferably 16 carbon atoms, 18 carbon atoms, or 20 carbon atoms).

Suitable alkyl thiols include commercially available alkyl thiols (Aldrich Chemical Company, Milwaukee, Wis.). Preferably, the ink solutions 20 consist primarily of a solvent and the organosulfur compound, with impurities including less than about 5% by weight of the ink solution; more preferably less than about 1%; even more preferably less than about 0.1%. Useful inks 20 can contain mixtures of different organosulfur compounds dissolved in a common solvent such as, for example, mixtures of alkyl thiol and dialkyl disulfide.

Aryl thiols, which include a thiol group attached to an aromatic ring, are also useful in the ink 20. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups.

Useful thiols can include linear conjugated carbon-carbon bonds, for example double bonds or triple bonds, and can be partially or completely fluorinated.

The ink solutions 20 can include two or more chemically distinct organosulfur compounds. For example, the ink can include two linear alkyl thiol compounds, each with a different chain length. As another example, the ink 20 can include two linear alkyl thiol compounds with different tail groups.

Although microcontact printing has been carried out using neat organosulfur compounds to ink the stamp, the delivery of organosulfur compounds to the stamp can be achieved more uniformly, and with less stamp swelling in the case of linear alkyl thiols and PDMS stamps, if delivered from a solvent-based ink. In some embodiments the ink includes more than one solvent, but most useful formulations need include only a single solvent. Inks formulated with only one solvent may contain small amounts of impurities or additives, for example stabilizers or desiccants.

Useful solvents are preferably compatible with PDMS (that is, they do not excessively swell PDMS), which is the most commonly used stamp material for microcontact printing. In microcontact printing, swelling of the PDMS stamp can lead to distortion of the patterned features and poor pattern fidelity. Depending on the inking approach, excessive swelling can also present significant challenges in providing mechanical support to the stamp.

Ketones can be suitable solvents for the ink solutions. In some embodiments, suitable solvents include, for example, acetone, methyl ethyl ketone, ethyl acetate, and the like, and combinations thereof. Acetone is a particularly preferred solvent. The one or more organosulfur compounds (for example, thiol compounds) are present in the solvent in a total concentration of at least about 3 millimoles (mM). As used herein, the "total concentration" refers to the molar concentration of all the dissolved organosulfur compounds taken in aggregate. The one or more organosulfur compounds (for example, thiol compounds) can be present in any total concentration in which the ink solution consists of essentially a single phase. The one or more organosulfur compounds (for example, thiol compounds) can be present in total concentrations of at least about 5 mM, at least about 10 mM, at least about 20 mM, at least 50 mM, and even at least about 100 mM.

The stamp 10 can be "inked" with the ink solution 20 of the invention using methods known in the art (for example, as described in Libioulle et al. "Contact-Inking Stamps for Microcontact Printing of Alkanethiols on Gold", *Langmuir* Vol. 15, pp. 300-304 (1999)). In one approach, an applicator (for example, a cotton swab or a foam applicator) impregnated with the ink solution 20 can be rubbed across the stamping surfaces 16 of the stamp 10, followed by drying of solvent from the stamping surfaces 16. In another approach, the stamping surfaces 16 can be pressed against an "ink pad" impregnated with the ink solution, the ink pad optionally being a PDMS slab. In another approach, the stamp can be charged with ink solution from its back side, relative to the printing surface. In the latter approach, the organosulfur compound diffuses through the stamp to reach the relief-patterned face (the face including the planar surface 12 and the pattern elements 14 with the stamping surfaces 16) for printing. In another embodiment, the relief-patterned printing face of the stamp can be immersed in the ink solution, followed by withdrawal and drying ("immersive inking").

In yet another embodiment, the stamp 10 may be mounted on a print roller and the stamping surfaces 16 can be applied against a moving web to form a SAM thereon. The print roller is preferably cylindrical. It is understood by one of ordinary skill in the art that a cylindrical roller can have some deviation from ideality, for example eccentricity, run out, or taper. Preferably, cylindrical print rollers according to the invention have radius of between 2 cm and 50 cm, more preferably between 5 cm and 25 cm, most preferably between 7.5 cm and 20 cm. For stamps having thickness and mounting means totaling a dimension that is small relative to the print roller radius, for example totaling less than 1 cm, the stamp mounted on a print roller preferably has a radius of curvature between 2 cm and 50 cm, more preferably between 5 cm and 25 cm, most preferably between 7.5 cm and 20 cm.

In some embodiments, the print roller rotates and the web moves in synchronicity. Examples of selected embodiments of this type are described in more detail below. What is meant by such rotation and such movement occurring in synchronicity is that for moving web, the stamping surface translates in unison with the moving web while they are in contact, avoiding slippage and associated pattern distortion. Stated differently, when the print roller rotates and the web moves in synchronicity, the velocity and trajectory of the web surface and the stamping surface are nearly identical (i.e., when they are in contact).

Figure 5:
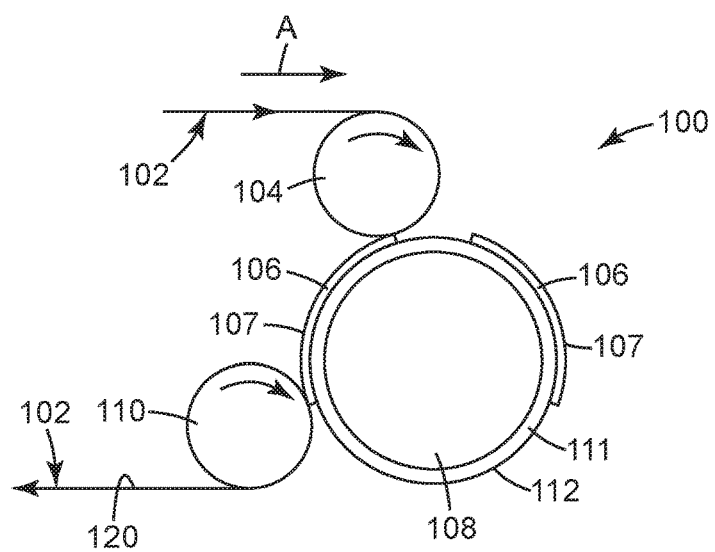
FIG. 5 is schematic view of a portion of an apparatus with a dual nip rollers and an extended process zone for use in microcontact printing in a roll-to-roll process.

FIG. 5 schematically illustrates an embodiment of a portion of a microcontact printing process line 100 well suited to forming SAMs on a web material 102 moving in a direction A in a roll-to-roll process. The web material 102 moves around a first support 104, this example a nip roller, and across at least one elastomeric stamp 106 made of a material such as PDMS. While the supports for the web material will be generally referred to herein as rollers, the supports utilized in the apparatuses shown in this application may include, but are not limited to, solid rolls, rolls with ball bearings, rolls with air bearings, sleeves supported by air or gas, non-contact supports such as air turns and air bars, air knives, and combinations thereof.

In some embodiments, the stamps 106 includes the high aspect ratio stamping pattern elements described above (FIG. 1), although any stamping pattern may be used. In the embodiment of FIG. 5, two stamps 106 are mounted on a print roller 108 to allow for continuous or stepwise continuous printing operations. The stamps 106 may be attached to the print roller 108 using any suitable technique, including, but not limited to, double-sided adhesive tapes, foam cushion-mount tapes, vacuum-based attachment, magnetic attachment, and mechanical attachment. Print rollers can have a nearly round outer solid surface and can be selected from, but not limited to, idler rolls with stationary shafts, idler rolls with moving shafts, idler rolls that have low friction bearings, air sleeves made out of thin metal shells 112 floated on thin air layer 111, air sleeves made out of hard metal shells 112 floated on air layer 111, rolls driven by motors, rolls made out of magnetic material, rolls made of material that allows lowering air pressure "vacuum" between that roll and the stamp, rolls and sleeves that allow for mechanical attachment of stamp.

In some embodiments, an optional elastomeric layer may be substituted for air layer 111 between the surface of the print roller 108 and the stamps 106. After the web material 102 contacts the stamp 106, the web material 102 moves around a second nip roller 110 and can then optionally be further processed on the process line 100.

Figure 6:
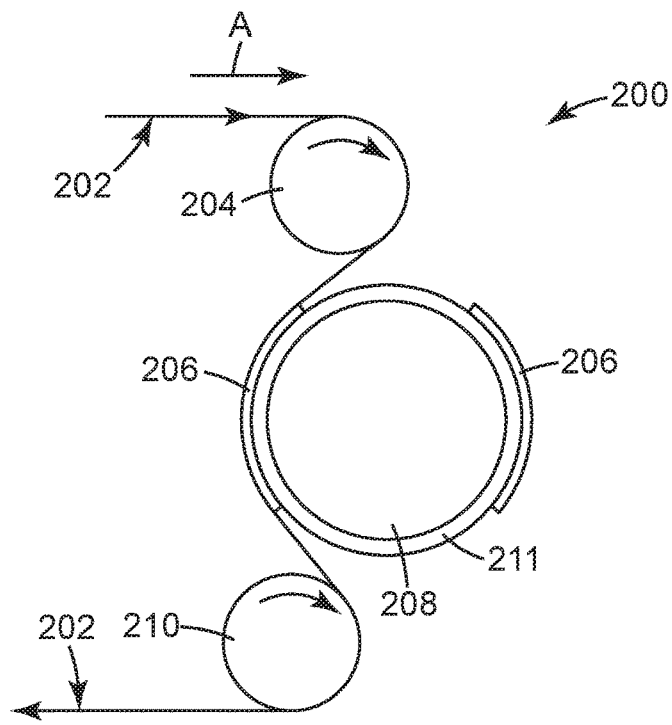
FIG. 6 is schematic view of a portion of a tensioned web apparatus with dual rollers for use in microcontact printing in a roll-to-roll process.

FIG. 6 schematically illustrates another embodiment of a portion of a microcontact printing process line 200 suitable for forming SAMs on a web material 202 in a roll-to-roll process. The web material 202 moves around a first tensioning roller 204 and across an arrangement of elastomeric stamps 206 made of a material such as PDMS. In some embodiments, the stamps 206 include the high aspect ratio stamping pattern elements described above (FIG. 1), although any stamping pattern may be used. The stamps 206 are mounted on a print roller 208. In some embodiments, an optional elastomeric layer 211 may be included between the surface of the print roller 208 and the stamps 206. After the web material 202 contacts the stamps 206, the web material 202 moves around a second tensioning roller 210 and may optionally be further processed on the process line 200. In this embodiment, the web material 202 is described herein to be tensioned between rollers 204 and 210, and the stamps are described herein as contacting the web material between the rollers 204 and 210.

Figure 7:
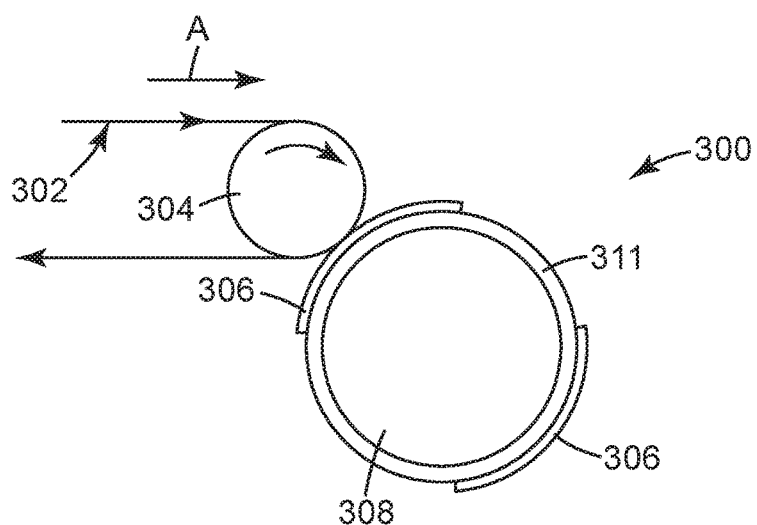
FIG. 7 is schematic view of a portion of an apparatus with a single nip roller for use in microcontact printing in a roll-to-roll process.

FIG. 7 schematically illustrates yet another embodiment of a portion of a microcontact printing process line 300 for printing SAMs on a web material 302 in a roll-to-roll process. The web material 302 moves around a single nip roller 304 and across two elastomeric stamps 306 made of a material such as PDMS. In some embodiments, the stamp 306 includes the high aspect ratio stamping pattern elements described above (FIG. 1), although any stamping pattern may be used. In some embodiments, an optional elastomeric layer 311 may be included between the surface of the print roller 308 and the stamps 306. After the web material 302 contacts the stamps 306, the web material 302 is prepared for further processing on the process line 300.

Figure 8:
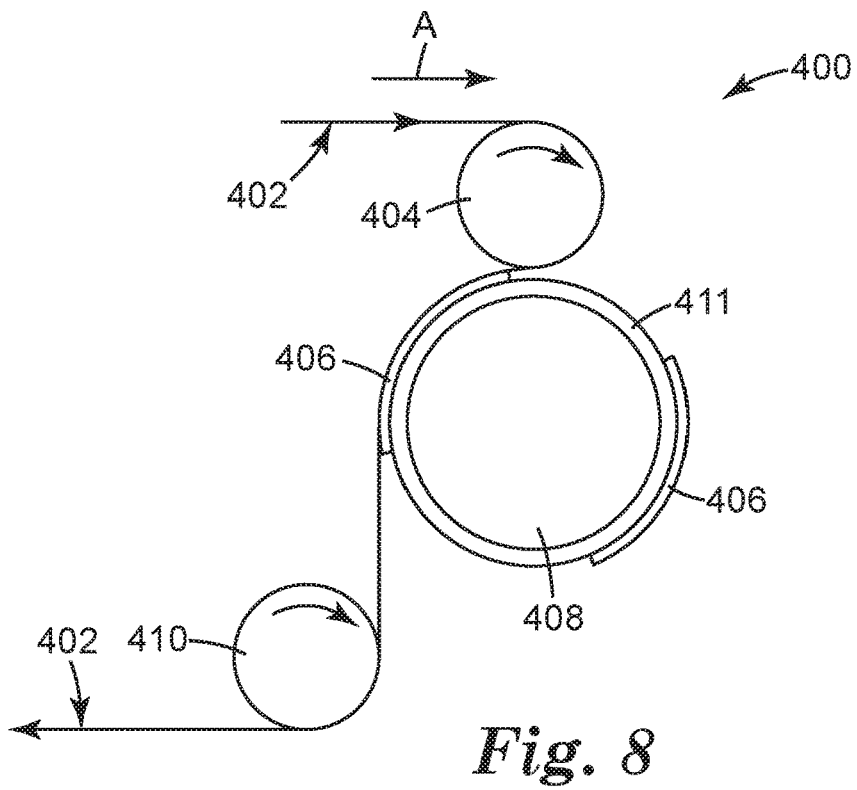
FIG. 8 is schematic view of a portion of an apparatus with a single nip roller and an extended process zone for use in microcontact printing in a roll-to-roll process.

FIG. 8 schematically illustrates yet another embodiment of a portion of a microcontact printing process line 400 for making SAMs on a web material 402 in a roll-to-roll process. The web material 402 moves around a nip roller 404 and across elastomeric stamps 406 made of a material such as PDMS. In some embodiments, the stamps 406 include the high aspect ratio stamping pattern elements described above (FIG. 1), although any stamping pattern may be used. In some embodiments, an optional elastomeric layer 411 may be included between the surface of the print roller 408 and the stamps 406. After the web material 402 contacts the stamps 406, the web material 402 moves around a tensioning roller 410 and can optionally be further processed on the process line 400.

In the embodiments of FIGS. 5-8 above, to reduce print defects, the tension on the portion of the web material contacting the stamps should be maintained at less than about 10 pounds per lineal inch (pli). In some embodiments, the tension on the web material should be maintained about 0.1 to about 5 pli, or about 0.1 to about 2 pli, or about 0.1 to about 1 pli.

In some embodiments of FIGS. 5-8, the web material 102 moves at a speed of about 0.1 to about 50 feet per minute (fpm).

In the apparatuses of FIGS. 5-8, inking the stamping surface may be achieved by a wide variety of techniques. For example, the print roller with stamps mounted thereon may be placed in an inking tank and charged with an ink composition including at least one functionalizing molecule. In this procedure the ink composition infuses into the stamps from the "front side," which herein refers to the side of the stamp including the pattern elements and stamping surfaces that contact the surface of the web material. The inked sleeve is subsequently removed from the inking tank and the ink-charged print roller is loaded onto the process line. After printing a predetermined length of the web material, the exhausted print roller (which at this point includes insufficient ink to form suitable patterns on the web material) is removed and re-inked in the inking tank for re-use at a later time.

Preferably, the inking time (the time the stamp is in contact with the ink during the ink-charging process) should be as short as possible, while still yielding an inked stamp with adequate printing performance. It is also desirable that the drying time following ink charging be as short as possible. These latter two factors drive the desire for ink compositions that are stable at high concentration and that can be dried rapidly on the stamp surface. Rapid evaporation of the ink solvent from the stamp surface is helpful for achieving a uniform distribution of the thiol molecules on or within the stamp with a minimum of time and application of forced air. For immersive inking it is preferred that the inking time is less than about 60 seconds, more preferably less than about 45 seconds, more preferably less than about 30 seconds, and even more preferably less than about 15 seconds. After withdrawal and drying, the inked stamp can then be placed in contact with a substrate such that contact is made with the raised regions of the relief-patterned surface of the stamp. The organosulfur compounds diffuse from the stamp onto the surface of the substrate where they can form SAMs.

Referring again to FIG. 5 as an example, all of the above described methods of inking render the patterned surface 107 of the stamps 106 inked, yielding an "inked surface."

Once inked, the stamps 106 are useful for transferring to a surface 120 of the substrate 102 a pattern of an ink including a functionalizing molecule such as an organosulfur compound. When the inked surface 107 of the stamps 106 includes an array of stamping pattern elements, the inked surface can be contacted with the web surface 120, which is essentially flat, to transfer an ink pattern to the surface 120. The pattern of the ink transferred to the surface 120 is essentially the same as the pattern of raised features in the stamping pattern of the inked surface 107 of the stamp 106. In such a process, the pattern of the ink is said to be transferred according to the stamping pattern of the inked surface 107 of the stamp 106. When the inked surface 107 of the stamp 106 is essentially flat, the inked surface 107 can be contacted to the surface 120 that includes a relief pattern to transfer an ink pattern to the surface 120, wherein the ink pattern is essentially the same as the pattern of raised features in the stamping pattern of the surface 120 of the substrate. In such a process, the ink pattern is said to be transferred according to the relief pattern of the surface 120 of the web material 102.

When the inked surface 107 of the stamp 106 includes a first relief pattern, the inked surface can be contacted to a surface 120 of a web material 102 that includes a second relief pattern to transfer a pattern of the ink that is defined by the regions of contact between the raised features of the first relief pattern and the raised features of the second relief pattern (that is, the intersection of relief patterns). In such a process, the ink pattern is said to be transferred according to both of the relief patterns.

The printing time (that is, the duration of contact between the stamp 106 and the surface 120 of the web material 102) required will depend upon various factors including, for example, the concentration or the ink solution and the pressure applied to the stamp. In some embodiments, the print time is less than 1 minute (preferably, less than about 30 seconds; more preferably, less than about 10 seconds; most preferably, less than about 5 seconds).

Figure 9:
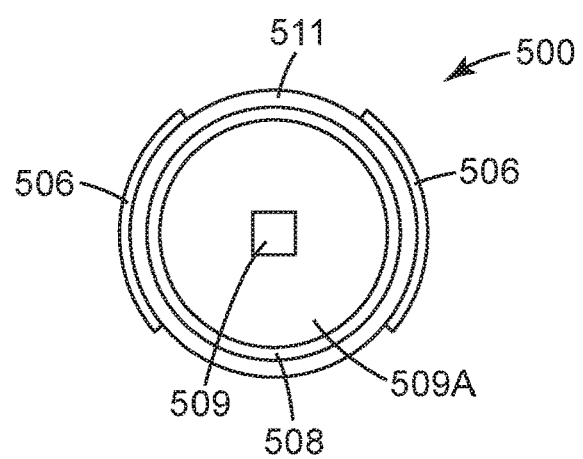
FIG. 9 is a schematic cross-sectional view of a fluid coupling for a print roller and a stamp in a microcontact printing apparatus.

Referring to FIG. 9, to reduce process and production line down-time necessitated by re-inking the stamps, in any of the embodiments of FIGS. 5-8 above, the print roller 508 may include a fluid coupling 509 to continuously diffuse or otherwise transport ink through the back side of the stamps 506. In this embodiment, the fluid coupling 509 may include a hollow interior region 509A that is periodically or continuously supplied with an ink composition including functionalizing molecules. The ink composition diffuses through the print roller 508, which in this embodiment is a drum made of a permeable or a highly porous material. An optional elastomeric layer 511 on the roller 508 may also be permeable to the ink composition, which diffuses into the "back side" of the stamps 506.

Figure 10:
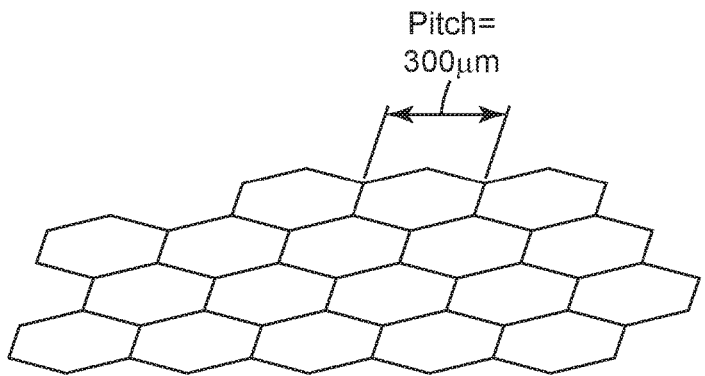
FIG. 10 is a schematic view of a front-side inking idler roller for use with a microcontact printing apparatus.

Referring to the apparatus 600 in FIG. 10, any of the embodiments shown in FIGS. 5-9 above may optionally include a continuous front-side re-inking idler roller 612. The idler roller 612 includes an inking surface 614 that is impregnated with an ink composition including a functionalizing molecule. The inking surface 614 contacts the stamping surface 607 of the stamps 606 during each revolution of the print roller 608. In some embodiments, the inking surface 614 of the idler roller 612 may be made of an elastomeric material such as PDMS, which may be periodically or continuously "charged" with an ink containing functionalizing molecules. An optional elastomeric layer 611 may be placed between the idler roller 612 and the inking surface 114.

The inking surface 614 may be periodically placed in an inking tank and front-side inked as described above, or may be continuously back-side inked using a fluid coupling 616 within the idler roller 612.

While microcontact printing is a preferred method for making patterned SAMs using the stamp configurations described herein, other methods of patterning can also be used. Other known methods for patterning SAMs include, for example, ink jet printing, use of the formation of gradients of the functional groups, and topographically directed assembly.

The patterned SAM formed from the stamp configurations described herein can be used, for example, as a resist that protects regions the underlying substrate surface during a subsequent patterning step. For example, the patterned SAM can provide an etch mask. As an etch mask, the regions of the substrate surface (for example, the surface of a metal coating on a polymeric film substrate) that are covered with the SAM are protected against the chemical action of an etchant, while regions of the substrate surface that are not covered with the SAM are not protected, allowing selective removal of material (for example, metal from a polymeric film substrate) in the unprotected regions. Alternatively, the patterned SAM can provide a plating mask. As a plating mask, the regions of the substrate surface (for example, the surface of a catalytic metal coating on a polymeric film substrate) that are covered with the SAM are rendered non-catalytic for deposition of metal from an electroless plating bath, while regions of the substrate surface that are not covered with the SAM remain exposed and therefore retain their catalytic activity, allowing for the selective placement of electrolessly deposited metal in the unprotected regions. Methodologies for the application of patterned SAMs as masks in the patterning of other materials are known in the art (for example, in U.S. Pat. No. 5,512,131).

The operation of various embodiments of the present disclosure will be further described with regard to the following detailed Examples.

EXAMPLES

The following Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Unless otherwise noted, all parts, percentages, ratios, and the like in the Examples and the rest of the specification are provided on the basis of weight. Solvents and other reagents used may be obtained from Sigma-Aldrich Chemical Company (Milwaukee, Wis.) unless otherwise noted.

Example 1

A high aspect ratio stamp master was obtained from Infinite Graphics Inc. (IGI) of St. Paul, Minn. IGI built the master by spin-coating a 5 micron layer of photoresist on glass and using gray lithography to image pattern elements with a trapezoidal cross-section. An epoxy copy (submaster) of the stamp master was made by a standard process that included making a poly(dimethylsiloxane) (PDMS) negative of the stamp master, and casting epoxy against that negative. A PDMS stamp was made by casting uncured PDMS on the epoxy submaster and curing.

The pattern elements on the PDMS stamp had a trapezoidal cross-sectional shape with a 5.6 to 7.8 µm base width, a wall angle from 20-30°, a 5 µm height h, and a width w of the stamping surface of 2 µm, resulting in an aspect ratio of about 2.5 (See, for example, FIG. 2). This stamp is referred to below as the high aspect ratio stamp.

A similar PDMS stamp was prepared having a width w of the stamping surface of 2 µm and a height h of 2 µm, which resulted in an aspect ratio of about 0.8. This stamp will be referred to below as the low aspect ratio stamp.

The low and high aspect ratio PDMS stamps were saturated by an ink composition including a functionalizing molecule and then transferred to a back-up print roller with a radius of 9 inches (about 23 cm). As shown in Tables 1-2 below, some of the stamps were mounted on a standard solid idler roller and some were mounted on an air sleeve, which is a thin metal shell that floats on a layer of air. As shown in Tables 1-2 below, in some runs the stamps were mounted directly on the back-up roller, and for other runs a foam layer was placed between the roller and the stamp. The foam was an elastomeric material available from 3M, St. Paul, Minn., under the trade designation 3M Cushion-Mount Plus Plate Mounting Tape, 1120 Tan.

The ink composition was applied with the PDMS stamps to an approximately 100 nm silver-coated PET (available under the trade designation ST504 from E.I. DuPont de Nemours, Wilmington, Del.). As shown in Tables 1-2 below, the web substrate moved at a speed of 15 feet per minute (fpm) and 25 fpm with respect to the stamps, and a varying web tension of 1 or 2 pounds per lineal inch (pli) were applied to form a SAM on the surface of the substrate. Each stamped pattern was evaluated to determine if there was line widening was observed (Y), no line widening was observed (N), or if the results were inconclusive (X)

TABLE 1

Low Aspect Ratio Stamp
Print Quality With Respect to Line Widening

| Stamp Mount Flexographic Foam Print Roll (Idler, Airsleeve) | Low Aspect Ratio Stamp | | | | | | | |
|---|---|---|---|---|---|---|---|---|
| | Foam | | | | No Foam | | | |
| | Idler | | Airsleeve | | Idler | | Airsleeve | |
| Web Line Speed | 15 | 25 | 15 | 25 | 15 | 25 | 15 | 25 |

TABLE 1-continued

Low Aspect Ratio Stamp
Print Quality With Respect to Line Widening

| | Low Aspect Ratio Stamp | | | | | | | | | | | | | | | |
|---|---|---|---|---|---|---|---|---|---|---|---|---|---|---|---|---|
| (fpm) | | | | | | | | | | | | | | | | |
| Web Tension (pli) | 1 | 2 | 1 | 2 | 1 | 2 | 1 | 2 | 1 | 2 | 1 | 2 | 1 | 2 | 1 | 2 |
| Line Widening Observed (Y/N) | Y | Y | Y | Y | Y | N | Y | X | | | | | X | N | Y | X |

TABLE 2

High Aspect Ratio Stamp
Print Quality With Respect to Line Widening

| | High Aspect Ratio Stamp | | | | | | | | | | | | | | | |
|---|---|---|---|---|---|---|---|---|---|---|---|---|---|---|---|---|
| Stamp Mount Flexographic Foam | Foam | | | | | | | | No Foam | | | | | | | |
| Print Roll (Idler, Airsleeve) | Idler | | | | Airsleeve | | | | Idler | | | | Airsleeve | | | |
| Web Line Speed (fpm) | 15 | | 25 | | 15 | | 25 | | 15 | | 25 | | 15 | | 25 | |
| Web Tension (pli) | 1 | 2 | 1 | 2 | 1 | 2 | 1 | 2 | 1 | 2 | 1 | 2 | 1 | 2 | 1 | 2 |
| Line Widening Observed (Y/N) | N | N | Y | X | N | N | X | N | X | X | Y | X | N | N | X | N |

The resulting SAMs produced by each PDMS stamp had a hexagonal pattern. As shown in Tables 1-2, it was observed that patterns printed with high aspect ratio stamps had significantly reduced widening of printed lines, fewer number of defects related to trapped particles, and are capable of printing at higher speeds without generating areas with missing prints.

Compared to the low aspect ratio stamp, the high aspect ratio stamp also allowed higher print speeds without defects associated with air entrapment. Typically, above a critical printing speed, part of the printed pattern disappears as the stamp no longer makes contact with the substrate.

Table 3 below shows a comparison in a number of air entrainment-related defects between low aspect ratio PDMS stamp (2 μm height h) and high aspect ratio PDMS stamps (5 μm height h). At 15 fpm printing speed the low aspect ratio stamp showed 14 defects while the high aspect ratio stamps had 4 or 0 defects.

The high aspect ratio stamps also reduced defects associated with the presence of dust and dirt particles. Table 3 below shows that the number of repeating defects that might be attributed to particulates reduced from 3 to 1 or 2 when the high aspect ratio stamp was used.

TABLE 3

| | Stamp 1 | Stamp 2 | Stamp 3 |
|---|---|---|---|
| Relief | Low Aspect Ratio | High Aspect Ratio | High Aspect Ratio |
| Mounting Foam | Yes | Yes | No |
| Repeating Defects | 3 voids | 1 void | 2 voids |
| # of air entrainment defects (15 fpm, approx. 1 pli web tension) | 14 | 4 | 0 |

Example 2

During roll-to-roll micro-contact printing process a roll with an elastomeric stamp comes into contact with a substrate on the second roll. The stamp and substrate are not necessarily in normal contact as two rolls move with different speeds resulting in the substrate moving relative to the stamp, which produces a drag force on the stamp surface and its stamping elements. If a threshold friction value is exceeded, the stamp can slip, which leads to printing resolution defects. A Finite Element model was developed to simulate the printing process and calculate the magnitude of the drag force on the stamp. The modeled results supplement the results in Example 1 above and demonstrated the advantage of higher relief stamps in reducing slippage effect on defect formation.

Figure 11:
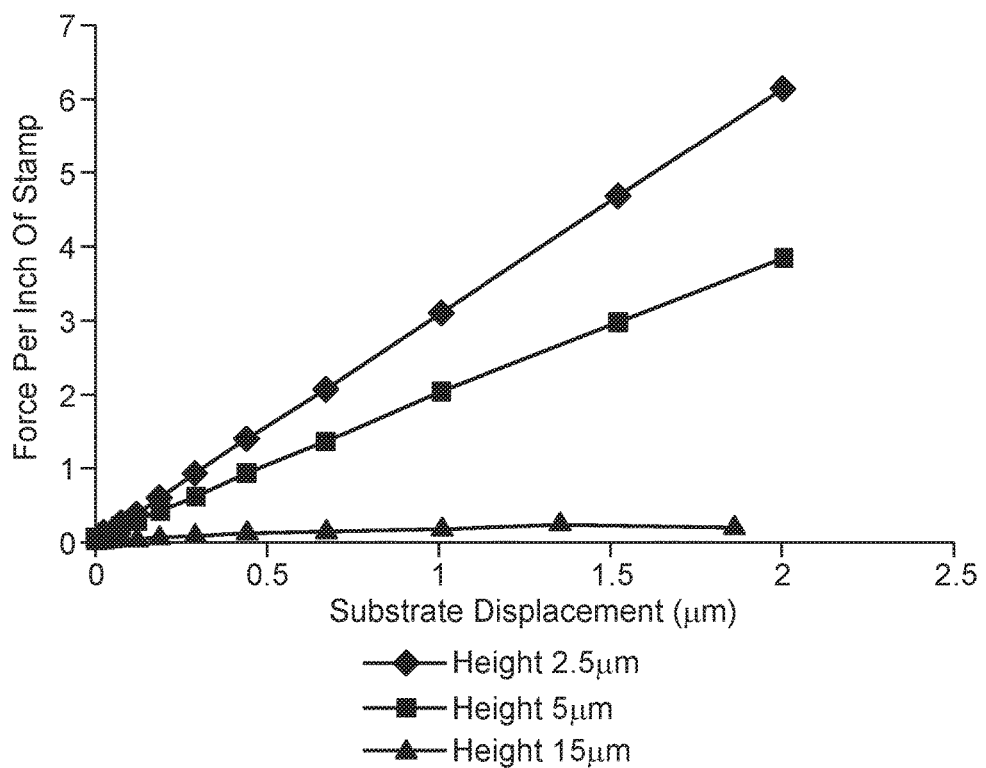
FIG. 11 is a schematic diagram of the modeled surface of a microcontact printing stamp utilized in Example 2.

The model of a 2D stamp cross-section was created using ANSYS 12.1 commercial software (available from ANSYS Inc., Canonsburg, Pa.). The model construction included 500 microns of foam adhesive mounted to a printing roll and 5 mm of stamp 1" wide with 300 micron pitch between the stamping elements. The stamping elements had a tapered trapezoidal cross-sectional shape (FIG. 2) with a vertical angle θ of 13.5°. The width at the base was 1.3 μm. We varied the aspect ratio using three different heights h of 2.5, 5, and 15 μm. A schematic view of the stamping surface is shown in FIG. 11.

In another example, the features were columnar with a rectangular cross-sectional shape, rather than the tapered trapezoidal shape. The printed substrate was modeled as a rigid surface to which loads are applied. Two types of loading were modeled: the first one had 0.25 pli of nip pressure (N.P.) and the second included both N.P. and 2 μm relative displacement parallel to the substrate moving direction. The model assumed that the stamping elements were not detaching from the web during loading ("standard contact" behavior for contact elements).

Both the foam mount and the stamp were modeled as hyperelastic materials, using NeoHookean material model with instantaneous shear modulus G=896 kPa for the stamp, and Blatz-Ko compressible foam model with G=876 kPa.

We found that the smaller the value of h, the loads produced less bending and more lateral movement of the stamping elements as a whole.

Figure 12:
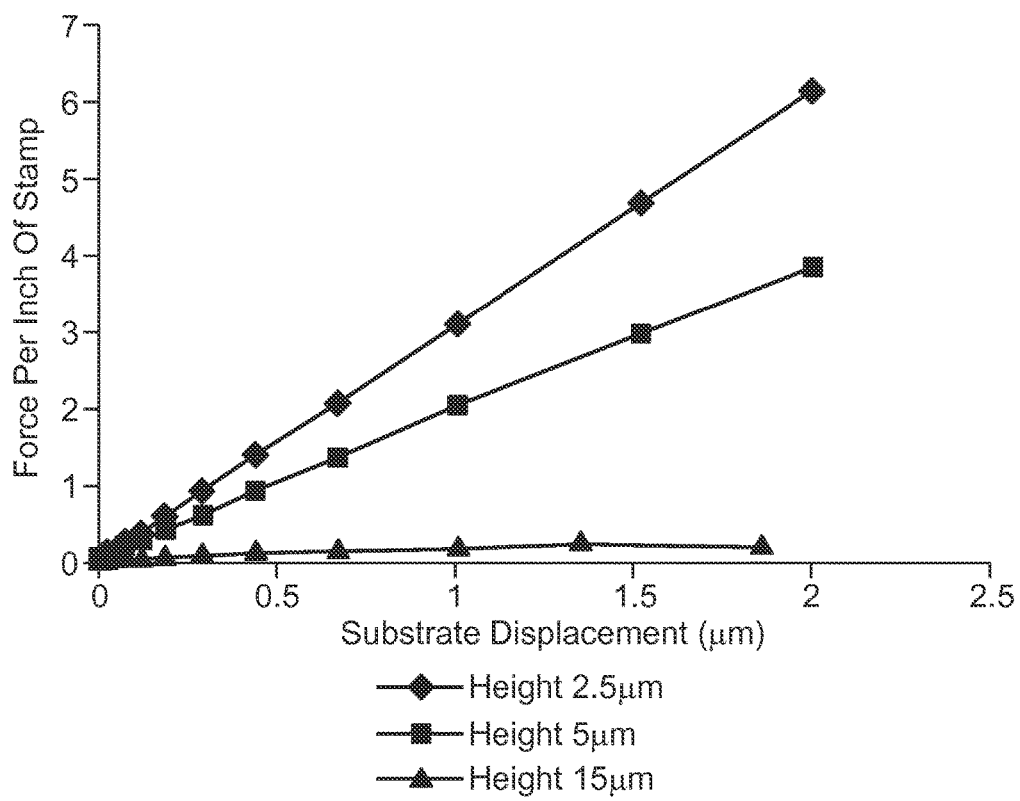
FIG. 12 is a plot of force per width inch of stamp vs. substrate displacement for the modeled microcontact printing stamps of Example 2.

FIG. 12 is a plot of resultant drag force per width inch vs. substrate displacement. This plot shows that if the drag force exceeds the force of maximum dry friction between the features and substrate, the former can slip back to its original location, which will result in a wider printed line. This possibility is reduced by using higher aspect ratio stamping elements.

The results of the modeling show that the stamping elements on the microcontact printing stamps experience both compression and bending. The high aspect ratio elements experienced smaller force to deform, which resulted in reduced possibility of their slippage on the substrate that leads to bad printing resolution. Columnar stems were highly unstable structurally and more likely to lose contact with the substrate, which can result in skipped lines in the printed SAM pattern.

Reference throughout this specification to "one embodiment," "certain embodiments," "one or more embodiments" or "an embodiment," whether or not including the term "exemplary" preceding the term "embodiment," means that a particular feature, structure, material, or characteristic described in connection with the embodiment is included in at least one embodiment of the presently described invention. Thus, the appearances of the phrases such as "in one or more embodiments," "in certain embodiments," "in one embodiment" or "in an embodiment" in various places throughout this specification are not necessarily referring to the same embodiment of the presently described invention. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove. Furthermore, all publications, published patent applications and issued patents referenced herein are incorporated by reference in their entirety to the same extent as if each individual publication or patent was specifically and individually indicated to be incorporated by reference.

Various exemplary embodiments have been described. These and other embodiments are within the scope of the following claims.

The invention claimed is:

1. A system, comprising:
a moving web of material unwound from a support;
an elastomeric stamp mounted on an air-supported sleeve made out of a metal shell floated on an air layer, overlaying a print roller, wherein the elastomeric stamp comprises a base surface and a continuous, regular array of pattern elements having a trapezoidal cross-sectional shape and extending above the base surface, and wherein the pattern elements each comprise a substantially planar stamping surface; and
an inking roller comprising an inking surface made of an elastomeric material that at least periodically contacts the stamping surface of the stamping elements, wherein the inking surface is impregnated with an ink composition comprising an organosulfur compound having a thiol functional group selected to bind to a major surface of the web of material to form a self-assembled monolayer (SAM) thereon according to the array of pattern elements extending above the base surface, wherein the pattern elements have a lateral dimension of about 0.25 microns to about 5 microns and a height with respect to the base surface, and wherein an aspect ratio of the height of the pattern elements to the lateral dimension of the pattern elements is about 1.5 to about 5.0.

2. The system of claim 1, further comprising an adhesive layer between the print roller and the elastomeric stamp.

3. The system of claim 1, wherein the inking surface comprises an elastomeric polymer, wherein the elastomeric polymer comprises a poly(dimethylsiloxane).

4. The system of claim 1, wherein the print roller is continuously fed with the ink composition, optionally wherein the re-inking roller is continuously fed with the ink composition from a fluid coupling within the re-inking roller.

5. A system, comprising:
a moving web of material unwound from a roller;
an elastomeric stamp mounted on an air-supported sleeve made out of a metal shell floated on an air layer, overlaying a print roller, wherein the elastomeric stamp comprises a base surface and a continuous, regular array of pattern elements having a trapezoidal cross-sectional shape and extending above the base surface, and wherein the pattern elements each comprise a substantially planar stamping surface that periodically contacts a major surface of the web of material, wherein the pattern elements have a lateral dimension of about 0.25 microns to about 5 microns and a height with respect to the base surface, and wherein an aspect ratio of the height of the pattern elements to the lateral dimension of the pattern elements is about 1.5 to about 5.0; and
an apparatus for inking the stamping surfaces with an ink composition comprising an organosulfur compound and an organic solvent, wherein the apparatus for inking the stamping surfaces comprises a re-inking roller with an inking surface made of an elastomeric material impregnated with the ink composition, and wherein the inking surface periodically contacts the stamping surfaces of the pattern elements of the elastomeric stamp.

6. The system of claim 5, wherein the inking surface of the re-inking roller comprises an elastomeric polymer, optionally wherein the elastomeric polymer comprises a poly (dimethylsiloxane).

7. The system of claim 5, wherein the re-inking roller is continuously fed with the ink composition, optionally wherein the re-inking roller is continuously fed with ink from a fluid coupling within the re-inking roller.

8. The system of claim 5, wherein the web of material is tensioned between a first roller and a second roller.

9. A method comprising:
unwinding a web of a substrate material from a support;
providing an elastomeric stamp on an air-supported sleeve made out of a metal shell floated on an air layer, overlaying a print roller, the elastomeric stamp being impregnated with an ink composition comprising a functionalizing molecule, each functionalizing molecule having a functional group selected to bind to the substrate material of the web, wherein the elastomeric stamp comprises a base surface and a continuous, regular array of pattern elements having a trapezoidal cross-sectional shape and extending above the base surface, and wherein the pattern elements each comprise a substantially planar stamping surface that periodically contacts a major surface of the web of the substrate material, wherein the pattern elements have a lateral dimension of about 0.25 microns to about 5 microns and a height with respect to the base surface, and wherein an aspect ratio of the height of the pattern elements to the lateral dimension of the pattern elements is about 1.5 to about 5.0;

periodically contacting the stamping surfaces of the pattern elements of the elastomeric stamp with a major surface of the web of the substrate material for a print time sufficient to bind the functional groups of the functionalizing molecules to the substrate material of the web to form a self-assembled monolayer (SAM) of the functionalizing molecules on the major surface of the web material according to the array of pattern elements on the stamping surface; and contacting the stamping surfaces of the pattern elements of the elastomeric stamp at least periodically with a re-inking roller, wherein the re-inking roller comprises an inking surface made of an elastomeric material impregnated with the ink composition.

10. The method of claim 9, wherein the web material moves at a speed of least about 10 feet per minute.

11. The method of claim 9, wherein the stamping surface comprises pattern elements with a lateral dimension of about 1 micron to about 5 microns.

12. The method of claim 9, wherein the thickness of the SAM on a surface of the web material is less than about 50 Å.

13. The method of claim 9, wherein the stamping surface comprises a poly(dimethylsiloxane).

14. The method of claim 9, wherein the functionalizing molecule is an organosulfur compound, optionally wherein the organosulfur compound is selected from at least one of alkyl thiols and aryl thiols.

15. The method of claim 9, wherein the major surface of the web material is a metal, optionally wherein the metal is silver.

16. The method of claim 9, wherein the web material is tensioned between a first support and a second support, and wherein the tension in the web material between the first support and the second support is at least 10 pounds per lineal inch.

* * * * *